United States Patent [19]

Batson et al.

[11] Patent Number: 4,821,030
[45] Date of Patent: Apr. 11, 1989

[54] TOUCHSCREEN FEEDBACK SYSTEM

[75] Inventors: Brian Batson; Brian D. Diehm, both of Lake Oswego, Oreg.

[73] Assignee: Tektronix, Inc., Beaverton, Oreg.

[21] Appl. No.: 944,290

[22] Filed: Dec. 19, 1986

[51] Int. Cl.$^4$ .............................................. G09G 3/00
[52] U.S. Cl. ................................... 340/712; 340/734; 324/121 R
[58] Field of Search ................... 340/712, 711, 365 P, 340/701, 750, 747, 734; 324/121 R

[56] References Cited

U.S. PATENT DOCUMENTS

| | | | |
|---|---|---|---|
| 4,104,725 | 8/1978 | Rose et al. | 324/121 R |
| 4,310,839 | 1/1982 | Schwerdt | 340/712 |
| 4,352,100 | 9/1982 | O'Connell | 340/750 |
| 4,413,314 | 11/1983 | Slater et al. | 340/712 |
| 4,451,895 | 5/1984 | Sliwkowski | 340/712 |
| 4,516,266 | 5/1985 | Christopher et al. | 340/701 |
| 4,521,870 | 6/1985 | Babbel et al. | 340/712 |
| 4,586,036 | 4/1986 | Thomason et al. | 340/747 |
| 4,639,881 | 1/1987 | Zingher | 340/712 |
| 4,646,250 | 2/1987 | Childress | 340/734 |
| 4,697,231 | 9/1987 | Boytor et al. | 340/712 |
| 4,710,758 | 12/1987 | Mussler et al. | 340/712 |

FOREIGN PATENT DOCUMENTS 0124724  3/1985  Japan ................................. 340/712

Primary Examiner—Gerald L. Brigance
Assistant Examiner—Mahmond Fatahiyar

[57] ABSTRACT

A computer-based digital oscilloscope includes a touchscreen mechanism for generating output signals indicating when an operator has touched the oscilloscope's screen and identifying a particular touch zone area that the operator has touched from among a plurality of touch zone areas of the screen. A computer which controls display of waveforms and other images on the screen, monitors the touchscreen output signals to determine whether the operator is touching a touch zone and to determine whether a portion of a particular image other than a waveform is displayed on the screen within boundaries of the touch zone. The computer generates a display of a first indicating image on the screen visually identifying the touch zone when not portion of any image other than a waveform is displayed on the screen within boundaries of said particular touch zone, and generates a display of a second indicating image on the screen visually identifying an image other than a waveform when any portion of the image is displayed on the screen within boundaries of the touch zone.

9 Claims, 8 Drawing Sheets

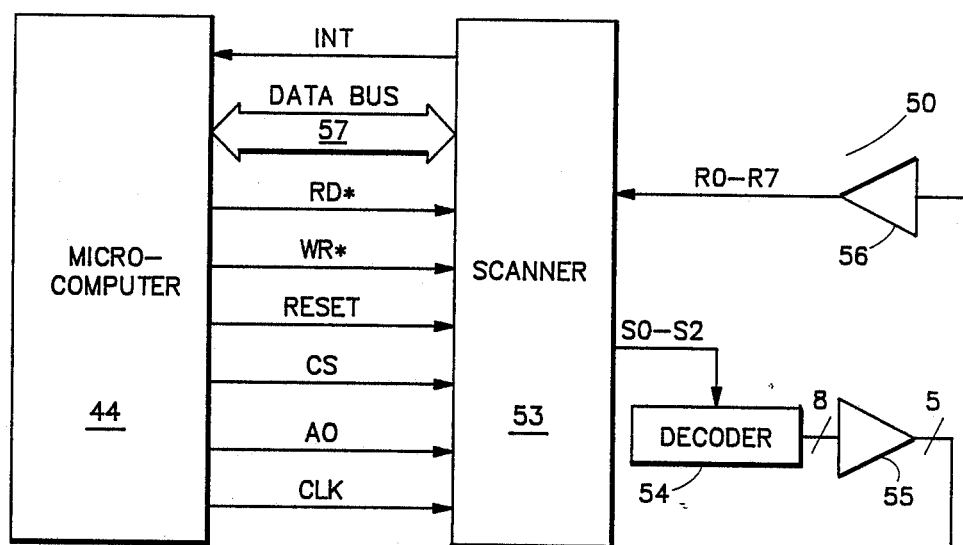
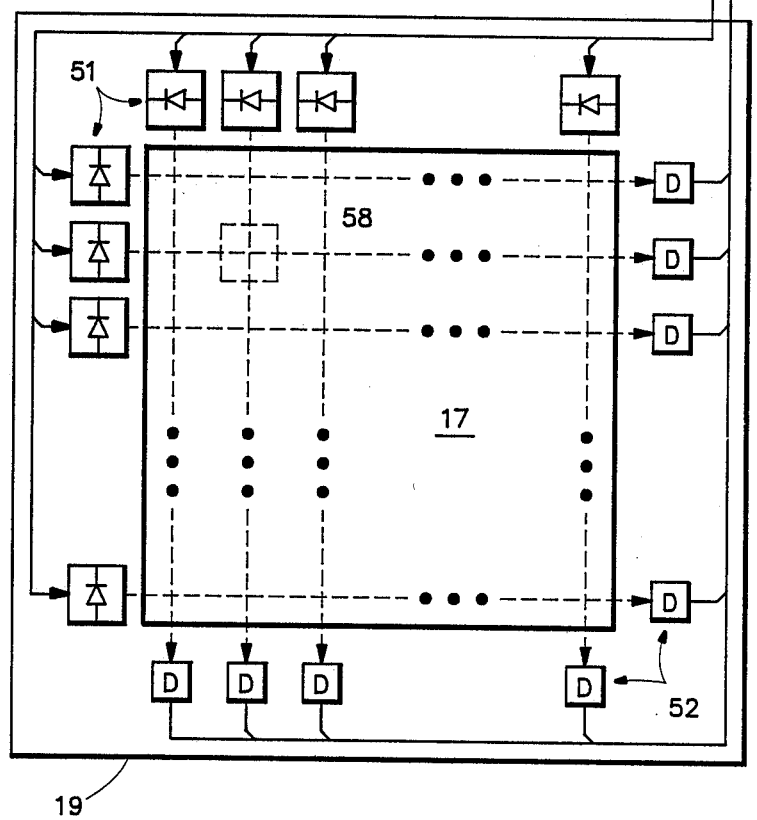
FIG. 3

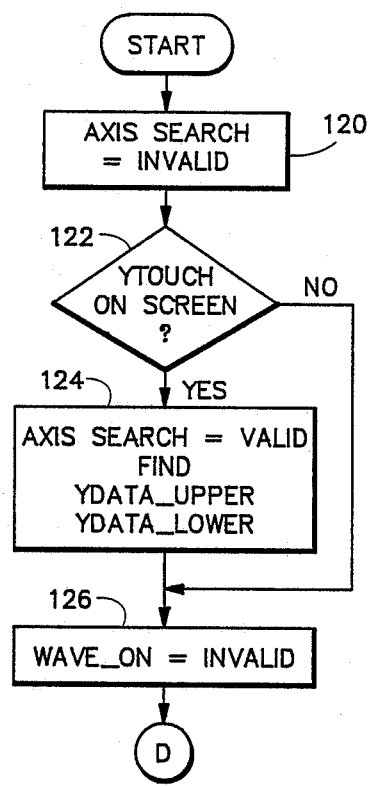
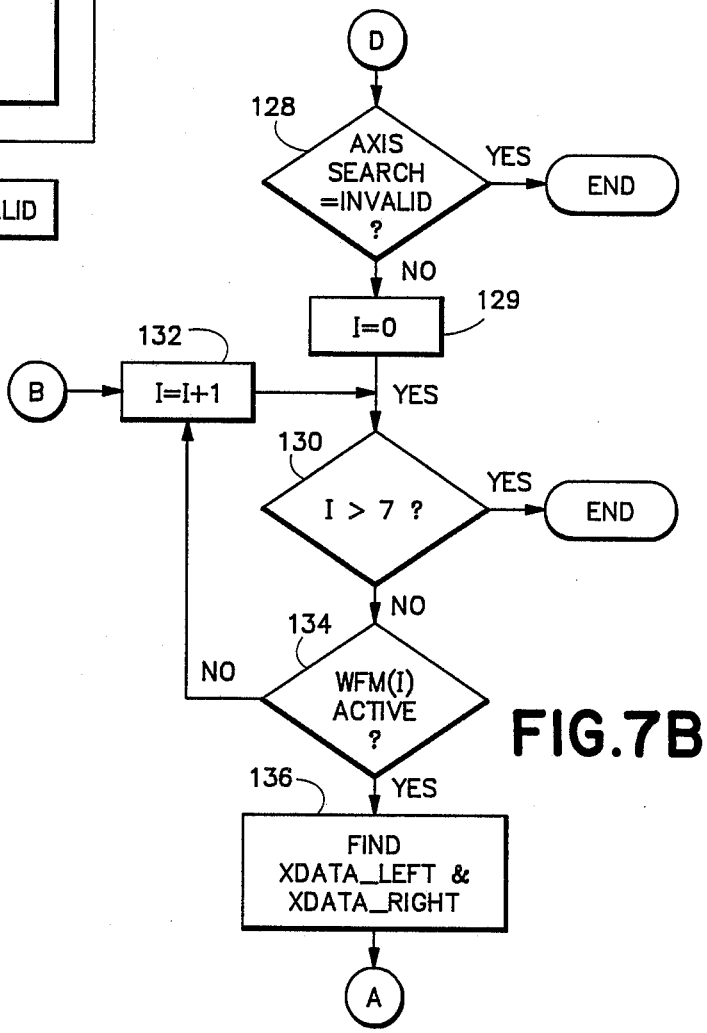
FIG. 7A
FIG. 7B

TOUCHSCREEN FEEDBACK SYSTEM

BACKGROUND OF THE INVENTION

The present invention relates to a touchscreen apparatus for providing input to a computer and in particular to a system for providing feedback to a touchscreen operator indicative of touchscreen input accepted by the computer.

A touchscreen typically comprises a set of photodetectors and a set of light emitting diodes (LEDs), one LED corresponding to each photodetector. The photodetectors and LEDs are distributed along the edges of a computer terminal screen with each LED and its corresponding photodetector being mounted on opposite edges of the screen so that each LED transmits a beam of light across the screen to its corresponding photodetector. The LEDs and photodetectors are usually arranged so that some light beams produced by the LEDs traverse the screen in a vertical direction while other light beams traverse the screen in a horizontal direction, and the horizontal and vertical light beams are spaced so as to form a regular, rectangular grid in front of the screen. Parallel beams are close enough together so that when an operator touches the screen with a finger, the finger usually prevents at least one vertical beam and at least one horizontal beam from striking its corresponding photodectector. Each photodetector produces an output signal of a high or low logic state depending on whether or not it detects the corresponding light beam, and the position of the operator's finger on the screen can be ascertained from the states of the photodetector output signals, provided the finger intercepts at least one horizontal and one vertical beam. The computer is normally programmed to determine from the horizontal and vertical beam intercepted that the operator has touched a point within a particular "touch zone", a rectangular area surrounding the intersection of the beams.

The computer may be programmed to respond to the touching of a particular touch zone similar to the way that it might otherwise be programmed to respond to the operation of a pushbutton. Thus, touchscreens are commonly used in computerized systems such as digital oscilloscopes which display menus, "selectable" icons or other objects on a screen because a touchscreen permits an operator to select an object or menu item by touching its image on the screen rather than, for example, by depressing a pushbutton corresponding to the selectable item. In such an application, a touchscreen not only eliminates or reduces the need for pushbuttons, it also tends to reduce opportunity for operator error since item selection is direct and intuitive.

Despite the many advantages of touchscreen input systems, they do have some drawbacks as opposed to keyboard or pushbutton-input systems. Because pushbuttons can be seen and are visually distinct from one another, when an operator depresses a particular pushbutton providing input to a computer, the operator can be reasonably certain that computer will recognize that particular pushbutton as having been depressed and not some other pushbutton. However, since an operator normally cannot see the light beams in a touchscreen, touch zones may not be visually distinct from one another. Thus the operator may not be certain that the computer has recognized that the operator has touched a particular touch zone and not an adjacent touch zone, particularly when light beam spacing is fairly close. In addition, since an operator's hand shakes somewhat, the edge of an operator's finger may intermittently intercept light beams causing the computer to think that one or more touch zones are being repeatedly touched and untouched, and the operator may have no indication of this.

What is needed is a system for providing feedback to an operator indicating the computer's perception of touchscreen operations.

SUMMARY OF THE INVENTION

In a system wherein a computer controls display of operator selectable items (such as, for example, icons or menu items) on a screen, a touchscreen input device comprises a set of photodetectors and a corresponding set of light emitting diodes (LEDs) arranged so that some light beams produced by the LEDs traverse the screen in a vertical direction while other light beams traverse the screen in a horizontal direction. The horizontal and vertical light beams are regularly spaced so as to form a rectangular grid in front of the screen. When an operator touches the screen with his or her finger, the finger may prevent vertical and horizontal light beams from striking corresponding photodetectors. Each photodetector produces a signal of a high or low logic state depending on whether or not it detects the presence of a beam, and a scanning device repeatedly scans the state of each photodetector and transmits data to the computer indicating which beams have been intercepted. The computer determines from this data when the operator has touched a point on the screen within a particular "touch zone", a rectangular area surrounding the intersection of intercepted and vertical and horizontal beams, and when the operator has stopped touching the screen. If a portion of a selectable item is displayed within a touch zone touched by the operator, then when the operator removes his or her finger from the screen, the computer assumes that the operator has selected the item and responds appropriately. The response may include highlighting the item to indicate that it has been selected or removing the item from the screen.

In accordance with one aspect of the invention, when the computer determines that the operator is touching a touch zone containing a portion of a single selectable item displayed on the screen, the computer provides a display on the screen distinguishing the selectable item as being touched. In the preferred embodiment of the invention, the item is surrounded by a bright, solid line. This tells the operator that the computer will select the item if the operator removes his finger from the screen without first touching another touch zone.

In accordance with another aspect of the invention, when the computer determines that the operator is touching a touch zone which may contain portions of more than one selectable item displayed on the screen, the computer provides a display on the screen indicating the touch zone touched. In the preferred embodiment of the invention, the touch zone is surrounded by a bright, solid line. This tells the operator that the computer has determined that a particular touch zone is being touched and that it may select an item when the operator stops touching the screen.

In accordance with another aspect of the invention, when the computer determines that the operator is touching a touch zone which cannot contain any portion of a selectable item displayed on the screen, the computer provides a display on the screen indicating the touch zone touched. In the preferred embodiment of the invention, the touch zone is surrounded by a bright, dotted line. This tells the operator that the computer has determined that a particular touch zone is being touched but that no item will be selected when the operator stops touching the screen.

It is accordingly an object of the invention to provide a new and improved system whereby a computer responds to input from a touchscreen by providing an operator with an indication as to which portions of a touchscreen the computer perceives as being touched, and by providing an indication as to the computer's future response when the operator subsequently stops touching the screen.

The subject matter of the present invention is particularly pointed out and distinctly claimed in the concluding portion of this specification. However, both the organization and method of operation of the invention, together with further advantages and objects thereof, may best be understood by reference to the following description taken in connection with accompanying drawings wherein like reference characters refer to like elements.

DRAWINGS

FIG. 3 is a block diagram of a portion of the input/output circuitry of FIG. 2 which provides touchscreen input/output interfacing;

FIGS. 7A-7C show a flow chart for programming the computer of FIG. 2 to respond to waveform selection.

DETAILED DESCRIPTION

Figure 1:
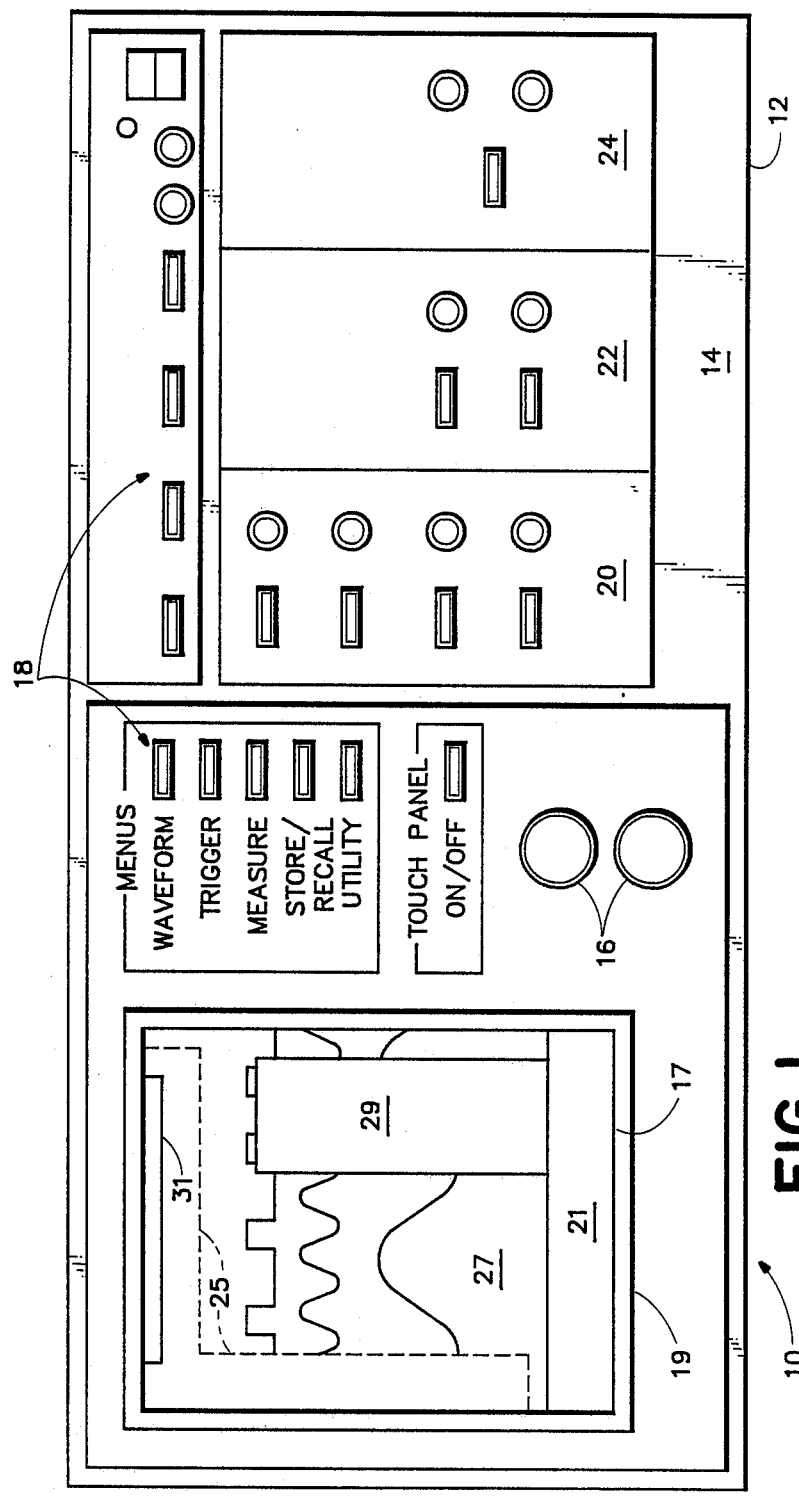
FIG. 1 is a front elevation view of an oscilloscope utilizing the present invention.

The present invention relates to a system for providing visual feedback to a user in response to operation of a touchscreen providing input to a computer controlling a display on a screen of an instrument, such as, for example, a computer-based digital oscilloscope. FIG. 1 depicts a front elevation view of such a computer-based digital oscilloscope 10 including a main chassis 12, a front panel 14 mounted on the chassis, control knobs 16, a screen 17 and pushbuttons 18 mounted on the front panel, as well as a set of three "plugins" 20, 22 and 24. Each plugin comprises a hardware subsystem of the oscilloscope mounted on a small, removable chassis "plugged" into main chassis 12 through a corresponding slot in front panel 14. The plugin hardware subsystems, interconnected with other hardware within chassis 12 through backplane wiring in chassis 12, may include vertical channel amplifiers, trigger systems and other equipment. Each plugin includes an individual front panel on which additional pushbuttons, control knobs and jacks may be mounted.

The screen 17 may display waveforms, menus, data and other graphics and text produced by the oscilloscope. "Knob" menus are permanently displayed in area 21 of screen 17 and are utilized to describe and control the functions of knobs 16. "Axis" menus are permanently displayed in area 25 of screen 17 and are utilized to describe and control horizontal and vertical scaling of waveforms displayed in a "waveform display area" 27 of screen 17. "Popup" menus 29 utilized to adjust various operations of the oscilloscope may be temporarily displayed in the waveform display are 27 superimposed over any waveforms displayed therein. A "message" menu 31 displaying messages to the operator may be temporarily displayed superimposed over an axis menu in area 25.

The oscilloscope includes a "touchscreen" 19, a mechanism comprising rows of light sources and light sensors distributed around the edge of the screen 17 for providing input data to the oscilloscope indicating which of a grid of rectangular areas ("touch zones") on the screen is being touched by an operator's finger. The touchscreen 19 is useful, for example, in permitting an operator to make selections from the menus displayed on the screen and also in permitting an operator to "select" a waveform. Oscilloscope 10 permits an operator to adjust various display attributes of each of the waveforms including for example, its vertical position on the oscilloscope's screen, the scaling of its vertical size, its trigger level, its color, its intensity, etc. In order to change a display attribute of a particular waveform, an operator first selects the waveform by touching it and then removes his or her finger from the screen. A computer within the oscilloscope determines the touch zone touched by the operator from data produced by the touchscreen, and if a waveform passes through the touch zone, the waveform is considered to have been "selected". The operator also calls forth the display of menus which enable the operator to reassign the operation of knobs so that they control the waveform display attributes that the operator wants to adjust. Once the waveform is selected, and the knob functions are properly assigned, the oscilloscope responds to operation of any of the knobs 16 by changing display attributes of the selected waveform.

In accordance with the present invention, when the computer determines that the operator is touching a touch zone containing a portion of a single selectable menu item displayed on the screen, the computer provides a display on the screen distinguishing the selectable menu item as being touched. In the preferred embodiment of the invention, the item is surrounded by a bright, solid line. This tells the operator that the computer will select the item if the operator removes his or her finger from the screen without first touching another touch zone. When the computer determines that the operator is touching a touch zone in waveform display area 27, the computer draws a bright, solid line around the touch zone to tell the operator that the computer has determined that a particular touch zone is being touched and that it may select any waveform passing though the touch zone if the operator removes his or her finger from the screen. On the other hand, when the computer determines that the operator is touching a touch zone which is not in waveform display area 27 and which does not contain any portion of a selectable menu item, the computer draws a dotted line around the touch zone to tell the operator that the computer has determined that a particular touch zone is being touched but that no response will be taken when the operator stops touching the screen.

Thus the oscilloscope 10 provides visual feedback to an operator to indicate its perception as to which menu item that the operator is currently touching. If the operator is not touching a menu item, the visual feedback indicates the boundaries of the touch zone that the operator is currently touching. The visual feedback also indicates the type of action that the oscilloscope may take when the operator removes his or her finger from the screen. If a menu item is surrounded by a solid line, the menu item will be selected, and if a touch zone is surrounded by a solid line, a waveform passing though the touch zone will be selected. If a touch zone is surrounded by a dotted line, no selection action will be taken.

Figure 2:
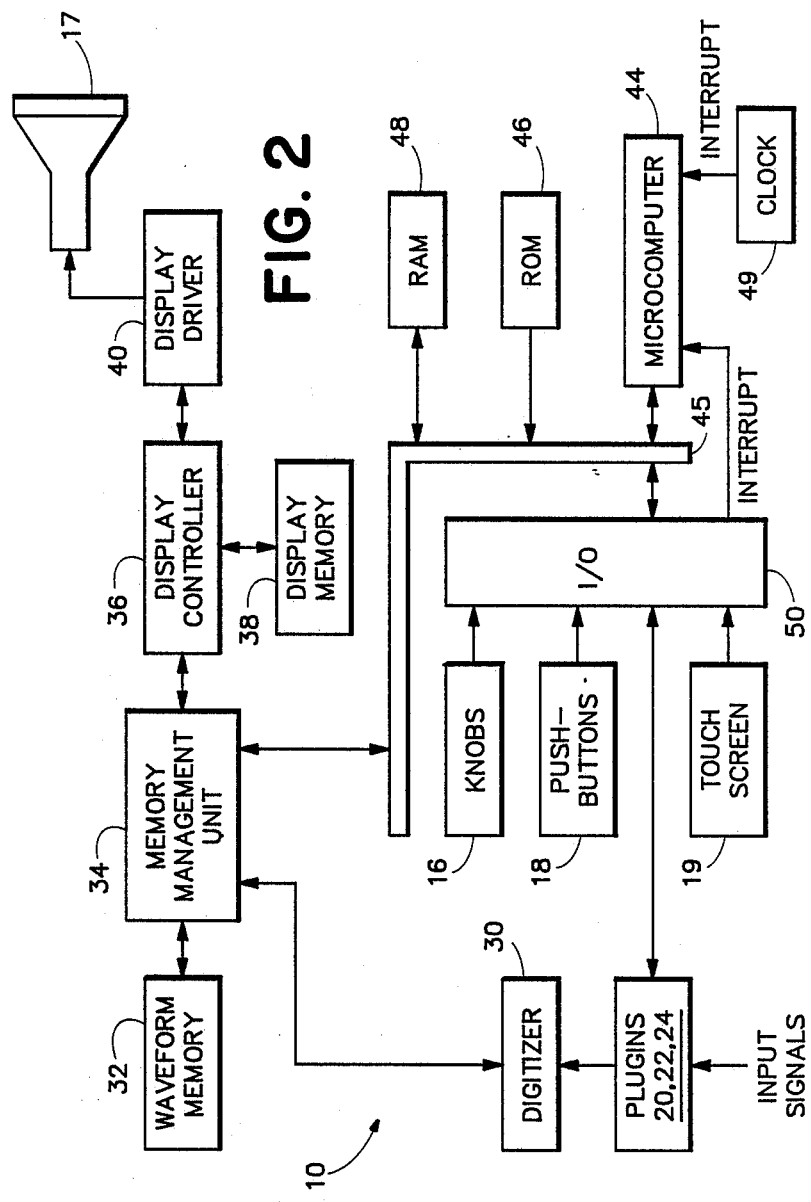
FIG. 2 is a block diagram of hardware associated with the oscilloscope of FIG. 1.

FIG. 2 is a block diagram of hardware associated with the oscilloscope 10 of FIG. 1. Signals produced by devices under test and applied as inputs to oscilloscope 10 through jacks on plugins 20, 22 and 24 are preconditioned by the plugins and applied as waveform and triggering inputs to a digitizer 30. The digitizer 30 digitizes selected input signals to produce sequences of waveform data representing the magnitude of successive input signal samples, and transmits these waveform data sequences for storage in a waveform memory 32 by way of a memory memory management unit 34 which arbitrates competing demands for access to the waveform memory 32. Memory management unit 34 is described in detail in copending U.S. patent application No. 912,024, filed Sept. 25, 1986, entitled "Concurrent Memory Access System", incorporated herein by reference. Through memory management unit 34, a display controller 36 acquires waveform data sequences stored in waveform memory 32 and utilizes these sequences to create a bit map of an oscilloscope display, the bit map being stored in a display memory 38. The display controller 36 periodically acquires bit map information from the display memory 38 and transmits it to a display driver 40 which produces a display on the cathode ray tube screen 17 of the oscilloscope 10 according to bit map data.

The memory management unit 34 also provides a microcomputer 44 with read and write access to waveform memory 32 by way of a computer bus 45 including control, data and address lines. Microcomputer 44 suitably comprises an Intel model 80286 processor and may include an Intel 80287 arithmetic coprocessor for performing fast arithmetic operations and an Intel 82258 direct memory access (DMA) controller for fast I/O operations. The microcomputer 44 operates under control of software (sometimes called "firmware") stored in a read only memory (ROM) 46 and utilizes a RAM 48 for temporary data storage, ROM 46 and RAM 48 being accessed through bus 45. Microcomputer 44 may be programmed to carry out a number of functions including, for example, the control of operating states of plugins 20, 22 and 24, digitizer 30, and display controller 36. The microcomputer 44 may provide control input signals to plugins 20, 22, and 24 through bus 45 to which the plugins are connected by means of suitable bus input/output (I/O) interface circuitry 50. Microcomputer 44 may further control digitizer 30 operating modes through commands sent over bus 45 and stored in waveform memory 32 by way of memory management unit 34, the stored commands being subsequently read out of memory 32 by digitizer 30. Microcomputer 44 determines which stored waveform data sequences display controller 36 is to display by sending commands to memory management unit 34 telling it to obtain selected waveform sequences from memory 32 and to transmit them to the display controller 36. Microcomputer 44 may also control the display of menus, graphics and data on screen 17 by storing display control data in waveform memory 32 and commanding memory management unit 34 to forward that data to the display controller 36.

Input signals, produced by operation of the oscilloscope main front panel knobs 16 and pushbuttons 18, by operation of knobs, pushbuttons or switches on the individual front panels of plugins 20, 22, or 24, and by operation of the touchscreen 19, are sensed by the I/O circuitry 50 which transmits messages to microcomputer 44 in response thereto. In response to the messages, computer 44 configures various subsystems of the oscilloscope for selected modes of operation. Firmware for controlling the display of menus and operation of microcomputer 44 in response to operation of oscilloscope front panel pushbuttons and the touchscreen is described in copending U.S. patent application No. 902,363, filed Aug. 29, 1986, entitled "Menu-based Oscilloscope Operating State Configuration System". A real time clock 49 is provided to transmit an interrupt signal to microcomputer 44 on a regular basis. The purpose of this interrupt signal will be discussed hereinbelow.

A method and apparatus for monitoring and validating touchscreen operations is described in copending U.S. patent application Ser. No. 06/939,645, filed Dec. 8, 1986, entitled "Touchscreen Input Validation System". FIG. 3 depicts in block diagram form touchscreen 19 and the interconnections between the touchscreen 19, the microcomputer 44, and a portion of the I/O circuitry 50 which provides touchscreen input/output interfacing. The touchscreen 19 includes a row of 11 light emitting diodes (LEDs) 51 mounted across the top edge of the screen 17 and a column of 22 LEDs 51 mounted along the left side of the screen. The LEDs 51 are arranged to produce an 11×22 grid of light beams immediately in front of the screen 17. A set of 33 photodetectors 52 are positioned along the bottom and right edges of the screen 17 so that a separate photodetector 52 is able to detect the light beam produced by each LED 51 when the beam reaches the edge of the screen directly opposite the LED. When the operator touches the screen, his finger may prevent one or more light beams from reaching photodetectors positioned to detect them and each photodetector 52 produces an output signal of state indicating whether the photodetector currently detects the light beam produced by the corresponding LED 51.

The I/O circuitry 50 includes a scanning circuit 53, suitably comprising an Intel model 8279 programmable keyboard interface device operating in its "sensor matrix" mode. Scanning circuit 50 produces a three bit count output (S0–S2) which is decoded by a decoder 54 to drive one of eight decoder output lines high, depending on the current count carried on lines S0–S2. Five of the eight decoder output lines are buffered by a set of buffers 55, and each of the outputs of buffers 55 are utilized to drive a separate group of up to eight of the 33 (11 horizontal and 22 vertical) LEDs 51. The output signal of each photodetector 52 is applied as an input to one of a set of eight buffers 56 and the outputs R0–R7 of buffers 56 are provided as inputs to the scanner 53.

During a scanning operation, the scanner 53 periodically increments its count output S0–S3. Each time the count output is incremented, decoder 54 energizes a separate one of its eight output lines, which in turn causes the corresponding buffer 55 to energize up to eight LEDs 51. Assuming that the operator does not interrupt any of the light beams produced by the energized LEDs, each photodetector 52 corresponding to an energized LED drives high an input to a separate one of the buffers 56, thereby driving high the output of buffer 56. When the operator's finger intercepts one of the light beams, the output of one of the photodetectors 52 is driven low, and its state will be reflected by output signal R0-R7 of one of the buffers 56. The scanner 53 includes an 8×8 bit memory for storing the state of each of the up to eight signals R0-R7 returned in response to each of the eight different values of its count output S0-S2. Once the count reaches its limit (111), it is reset to 000 and starts over. The new data R0-R7 acquired for each count value replaces the data acquired for that same count value during the previous count cycle. Thus each of 33 of the 64 data bits in the internal memory in the scanner indicates whether or not a separate one of the 33 photodetectors 52 detected a light beam during the last scanner count cycle. The remaining 31 data bits are not utilized for indicating touchscreen output signal states.

The scanner 53 also includes provisions for comparing the current states of the input signals R0-R7 produced in response to its current count output S0-S2 to the states of data stored in its internal memory when the count last had the same value. Whenever the scanner 53 determines the state of at least one of the R0-R7 signals has changed, it replaces the previously stored data with the new data, transmits an interrupt signal (INT) to microcomputer 44, and then suspends its scanning operation. When the microcomputer 44 receives the interrupt signal, it reads all 64 bits of data in the scanner memory as a sequence of 8-bit words, the data being passed to the microcomputer over an 8-bit data bus 57. The microcomputer 44 determines from this data whether and where the operator is touching the screen. Once the microcomputer has acquired and processed the scanner data, it transmits an end interrupt command to the scanner 53 which signal tells the scanner to resume its scanning operation.

Other signals provided to the scanner 53 by the microcomputer 44 include a clock signal CLK utilized by the scanner for internal timing, a RESET signal for initializing scanner operation, a chip select signal CS for enabling data bus interface circuitry within the scanner to transmit or receive data, read and write signals RD* and WD* (the * symbol means the signal is active low) for controlling the direction of data flow on bus 57, and a line A0 of the microcomputer's address bus utilized to indicate whether signals transmitted to the scanner on the data bus 57 are data or commands.

The resolution with which the microcomputer 44 determines the position of the operator's finger on screen 17 depends on the number of horizontal and vertical light beams utilized by the touchscreen mechanism 19. When one vertical and one horizontal beam is intercepted by the operator's finger, microcomputer 44 can determine that the finger is within a particular "touch zone", a rectangular area surrounding the point of intersection of the two beams, such as, for example, touch zone 58. Each light beam intersection thus defines the center of a separate touch zone such that the screen is divided into a grid of touch zones.

The operation of the microcomputer 44 in handling touchscreen input data is controlled by a touchscreen interrupt routine and a clocked interrupt routine. The touchscreen interrupt routine is initiated when scanner 53 interrupts the microcomputer 44 in response to a change in the touchscreen output data. In executing the touchscreen interrupt routine the microcomputer 44 reads the touchscreen data stored in the scanner and sets the values of parameters to indicate the coordinates of any touch zone touched by the operator, or to indicate that the operator is not touching the screen, as determined from the touchscreen data. The clocked interrupt routine is initiated periodically, whenever the clock 49 of FIG. 2 generates an interrupt signal (suitably every 20 msec.). In executing the clocked interrupt routine, the microcomputer 44 determines if the current touch zone coordinates indicated by the parameters set during the touchscreen interrupt routine have remained the same for a predetermined number of clocked interrupts, and if so, enqueues a command in a command queue. The command includes the coordinates of the touch zone touched by the operator, or indicates that the operator has stopped touching the screen. The commands in the command queue invoke routines which cause the microcomputer 44 to respond in various ways depending on the touchscreen information conveyed in the command.

Figure 4:
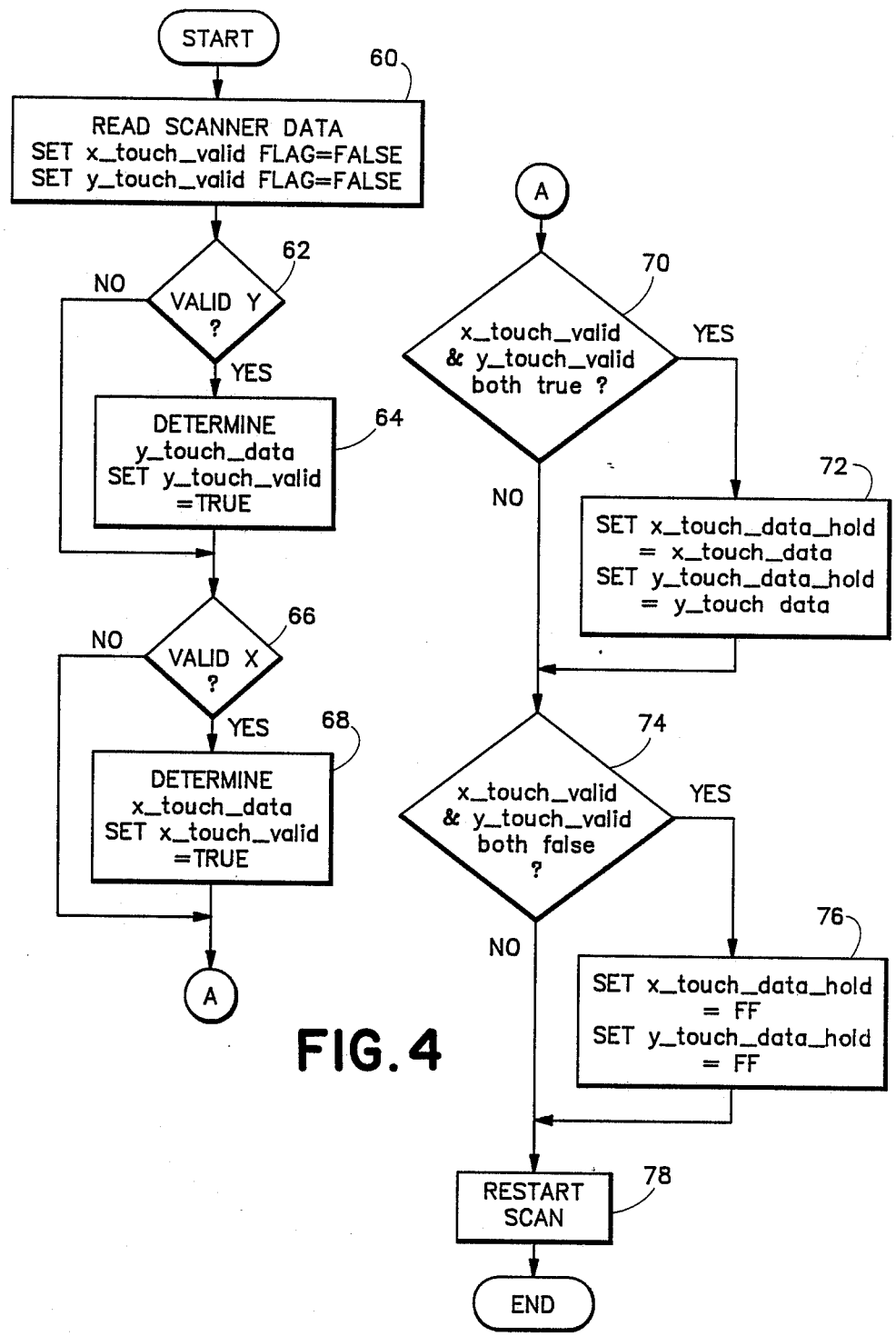
FIG. 4 shows a flow chart for programming the computer of FIG. 2 to execute a touchscreen interrupt routine.

The touchscreen interrupt routine is depicted in flowchart form in FIG. 4. With reference to FIG. 4, the touchscreen interrupt routine begins in block 60 where the microcomputer acquires the touchscreen data from the scanner and sets a pair of flags, x_touch_data_valid and y_touch_data_valid, to "false" states. Then (block 62) the microcomputer processes the touchscreen data bit-by-bit to determine if the data indicates that the operator's finger intercepted a vertical light beam, thereby indicating a "Y" coordinate of a touch zone touched by the operator. When a bit indicates that the operator's finger intercepted a vertical light beam, the microcomputer sets the value of a y_touch_data parameter to indicate the Y coordinate and sets the y_touch_valid flag to a true state (block 64). If no valid Y coordinate is found in block 62, or after executing the instructions of block 64, the microcomputer checks the touchscreen data to determine if it indicates that the operator's finger intercepted a horizontal light beam (block 66), thereby indicating an "X" coordinate of a touch zone touched by the operator. If so, the microcomputer sets the value of an x_touch_data parameter to indicate the X coordinate and sets the x_touch_valid flag to a true state (block 68).

Next (block 70) the states of the x_touch_valid and y_touch_valid flags are checked to determine if they are both true, indicating that the operator has touched a touch zone identified by the screen coordinates represented by the x_touch_data and y_touch_data parameters. In such case (block 72) the values of an x_touch_data_hold parameter and a y_touch_data_hold parameter are set equal to x_touch_data and y_touch_data, respectively. After executing block 72, or immediately after executing block 70 if the x_touch_valid and y_touch_valid flags are not both true, the microcomputer (in block 74) checks the x_touch_valid and y_touch_valid flags to determine if they are both false. If so, this indicates that the operator has just removed his finger from the screen and (in block 76) the x_touch_data_hold and y_touch_data_hold parameters are each set to the hexadecimal value FF, used to indicate that the operator is not touching the screen. Thereafter, or after block 74 if the x_touch_valid and y_touch_valid flags are not both false, the microcomputer restarts the touchscreen scan (block 78) by sending the end interrupt command to the scanner. The touchscreen interrupt routine then ends.

Thus when executing in the touchscreen interrupt routine of FIG. 4, the microcomputer reads the touchscreen data produced by the scanner, determines from the data if the operator's finger is intercepting a horizontal and a vertical light beam, and if so, sets the values of x_touch_data_hold and y_touch_data_hold to indicate the coordinates of the touch zone touched by the operator. If no vertical beam and no horizontal beam have been intercepted, then the microcomputer sets the values of x_touch_data_hold and y_touch_data_hold each to FF to indicate that the operator is not touching the screen.

If, however, the data indicates that the operator's finger is intercepting a vertical beam, but not a horizontal beam, or is intercepting a horizontal beam but not a vertical beam, then the microcomputer does not change the values of x_touch_data_hold and y_touch_data_hold. These situations may arise when the operator touches the screen with an object such as a pencil point which is so small that it may only intercept a vertical beam but not a horizontal beam, or vice versa. It also arises due to the manner in which the scanner operates. Recall that the scanner reads not more than eight photodetector output signals at a time and stops its scanning operation whenever it detects a change in output of the currently scanned photodetectors. When an operator touches the screen, his finger may intercept a horizontal and a vertical beam, but photodetector output signals responsive to these light beams may not be read during the same scanner count cycle. When the scanner reads, for example, the photodetector output signal representing the state of the intercepted vertical beam first, the scanner updates its stored touchscreen data for the change in that output signal and then interrupts the microcomputer and stops its scan. It does not update the stored data for the change in the state of the photodetector output signal representing the state of the horizontal beam until after the microcomputer has read the touchscreen data and transmitted the end interrupt command to the scanner. Thus, at one point it appears to the microcomputer that only a vertical beam has been intercepted, and according to the touchscreen interrupt routine of FIG. 4, the microcomputer makes no change to the previous values of x_touch_data_hold and y_touch_data_hold. After the scanner resumes its scanning operation, it detects the change in the output signal of the photodetector associated with the intercepted horizontal beam, changes the touchscreen data accordingly, and again interrupts the microcomputer. This time the touchscreen data read by microcomputer indicates that both horizontal and vertical beams have been intercepted, and the microcomputer updates the values of x_touch_data_hold and y_touch_data_hold accordingly. Thus the touchscreen interrupt routine alters the value of the x_touch_data_hold and y_touch_data_hold parameters only when it can determine the coordinates of a touch zone touched by the operator or when it determines that the operator has stopped touching the screen.

Figure 5:
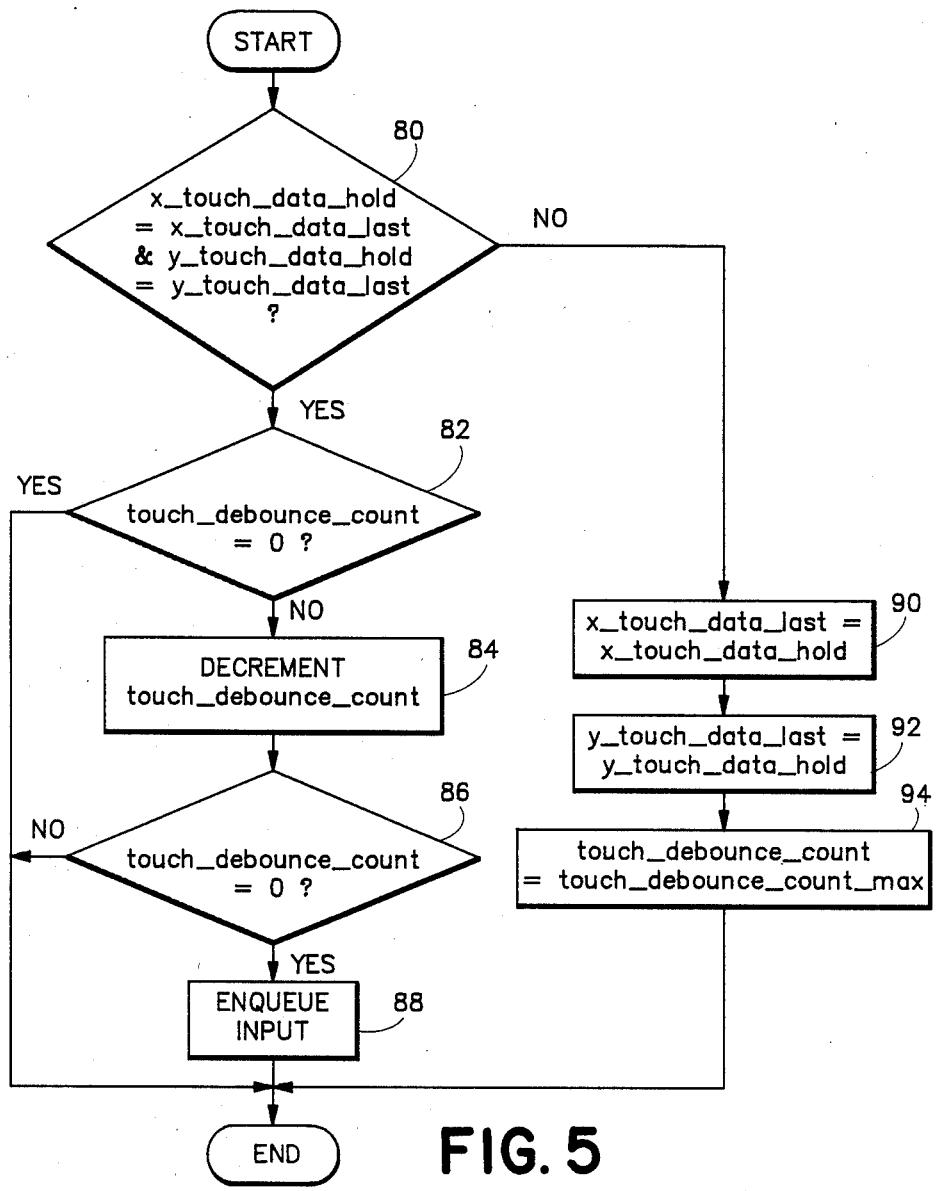
FIG. 5 shows a flow chart for programming the computer of FIG. 2 to execute a clocked interrupt routine.

The clocked interrupt routine is depicted in flow chart form in FIG. 5. With reference to FIG. 5, the clocked interrupt routine begins in block 80 where the current value of the x_touch_data_hold parameter is compared to the value of an x_touch_data_last parameter and the current value of the y_touch_data_hold parameter is compared to the value of a y_touch_data_last parameter. The x_touch_data_last and y_touch_data_last parameters have values which are equal to previous values of the x_touch_data_hold and y_touch_data_hold parameters as of the last time the clocked interrupt subroutine was initiated. If the current value of x_touch_data_hold is not equal to the value of x_touch_data_last and the current value of y_touch_data_hold is not equal to the value of y_touch_data_last, then a change in the touchscreen input has been detected by the scanner and acknowledged by the touchscreen interrupt routine since the last time the clocked subroutine was executed. In such case (blocks 90 and 92) the x_touch_data_last parameter is set equal to the current value of x_touch_data_hold and the y_touch_data_last parameter is set equal to the current value of y_touch_data_hold and (block 94) an integer variable, touch_debounce_count, is set to a maximum value (touch_debounce_count_max). Thereafter the clocked interrupt routine ends.

However, if the current values of x_touch_data_hold and y_touch_data_hold are the same as they were the last time the clocked interrupt routine was executed (block 80), then the touch_debounce_count variable is checked to see if it is equal to 0 (block 82). If it is, the clocked interrupt routine ends without further action. If not, the touch_debounce_count variable is decremented by one if the count is greater than 0 (block 84) and then again checked (block 86) to see if it is 0. If the touch_debounce_count variable is not equal to 0, the routine ends. If touch_debounce_count is equal to 0, a subroutine is called which enqueues a command for causing the microcomputer to take an appropriate response to the operator's touch of the touch zone indicated by the current values of x_touch_data_hold and y_touch_data_hold, or alternatively, when the x_touch_data_hold and y_touch_data_hold parameters have values FF, to take an appropriate response to the operator's removal of his finger from the screen.

When the value of touch_debounce_count_max utilized in block 94 is set, for example, to 10, the x_touch_data_hold and y_touch_data_hold parameters must remain unchanged by the touchscreen interrupt routine for 10 consecutive clock interrupts before the clocked interrupt routine enqueues a command causing the microcomputer to carry out an action in response to a screen touch (or in response to termination of a screen touch). This ensures that when the edge of the operator's finger is so close to one or more light beams that the repeated interrupts caused by the natural shaking of his finger do not cause a succession of commands to be enqueued. It also ensures that a succession of commands are not enqueued when the operator rapidly moves his finger across the screen. The decisions in blocks 82 and 86 ensure that one command is enqueued after the touchscreen input has remained constant for 10 clocked interrupts and that no further commands are enqueued as long as the touchscreen input continues to remain constant. When the value of touch_debounce_count_max is set to 10, and when the clocked interrupt routine is executed every 20 milliseconds, the clocked interrupt routine enqueues a command to respond to a valid touchscreen operation about 0.2 seconds after the touchscreen operation.

Figure 6:
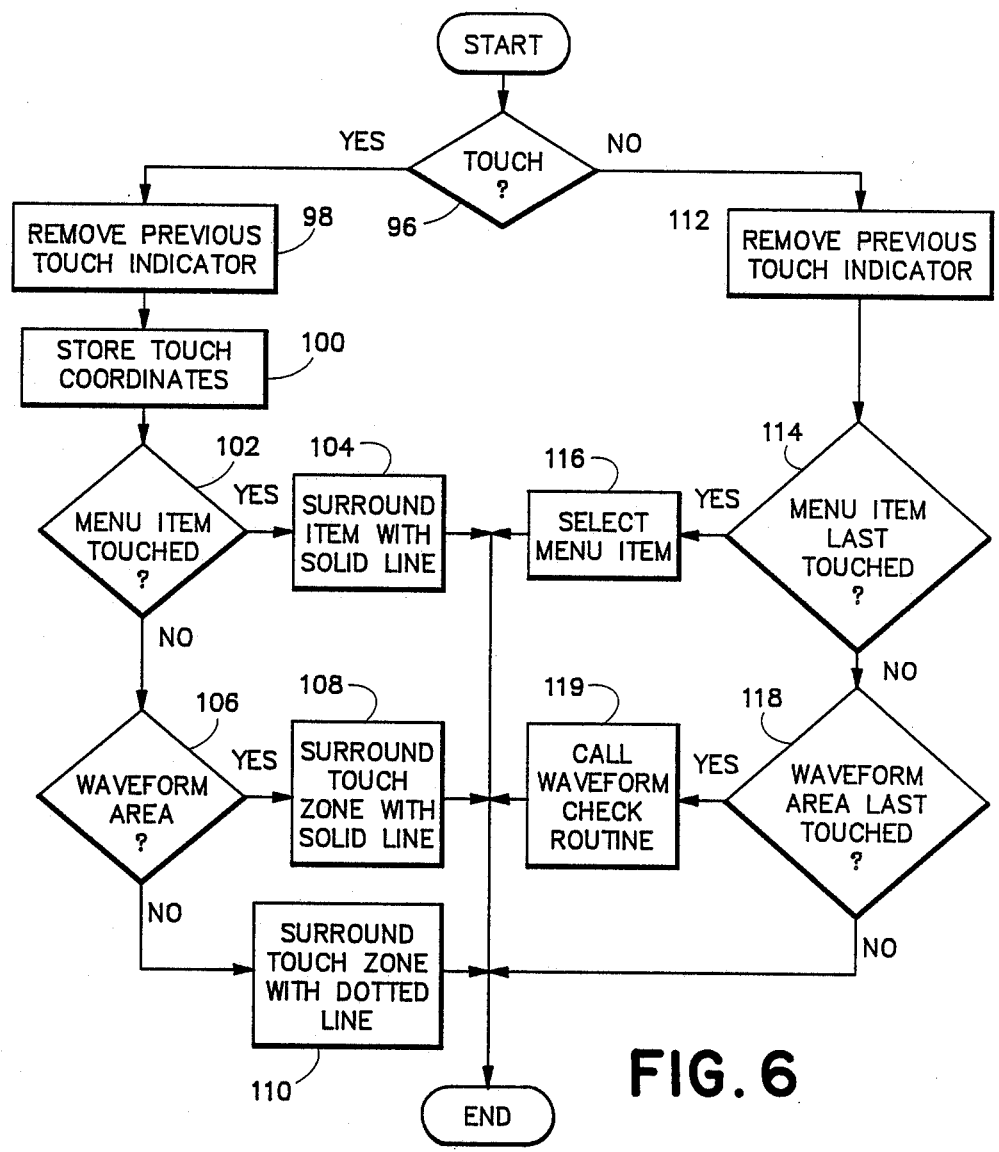
FIG. 6 shows a flow chart for programming the computer of FIG. 2 to respond to an enqueued touchscreen event.

FIG. 6 shows a flow chart for programming the computer of FIG. 2 to respond to an enqueued touchscreen event according to the present invention. Starting in block 96, the computer determines whether the touchscreen event was a screen touch or was a screen "untouch". If the event was a screen touch, the currently displayed touch indicator (if any) is removed from the display (block 98) and the coordinates of the currently touched touch zone are stored for future reference. If a touch zone including a portion of a menu item is touched (block 102), then the computer draws a solid line around the menu item (block 104) and the routine ends. If touch zone being touched does not include a menu item (block 102) and is included in the waveform area (block 106), then the computer draws a solid line around the currently touched touch zone (block 108) and the routine ends. If a menu item is not being touched (block 102), and the touch zone is not included in the waveform area (block 106), then the computer draws a dotted line around the touch zone (block 110) and the routine ends.

If the touchscreen event was not a screen touch (block 96) but rather was a screen untouch, then (block 112) the computer removes the current then (block 112) the computer removes the current touch indication. If the stored touch zone coordinates indicate that the last item touched was a selectable menu item (block 114), then the microcomputer executes an appropriate subroutine in response to the menu item selection (block 116) and the routine ends thereafter. If the stored touch zone coordinates indicate that a waveform area was last touched (block 118), then the computer executes a subroutine (119) which checks to see if a portion of a waveform is included in the last touch zone touched and, if so, initiates an appropriate response to selection of the waveform. The routine ends thereafter. If the last touched touch zone did not include a portion of a selectable menu item (block 114) and was not in the waveform display area (block 118), then the routine ends without causing the computer to take further action.

Figure 7C:
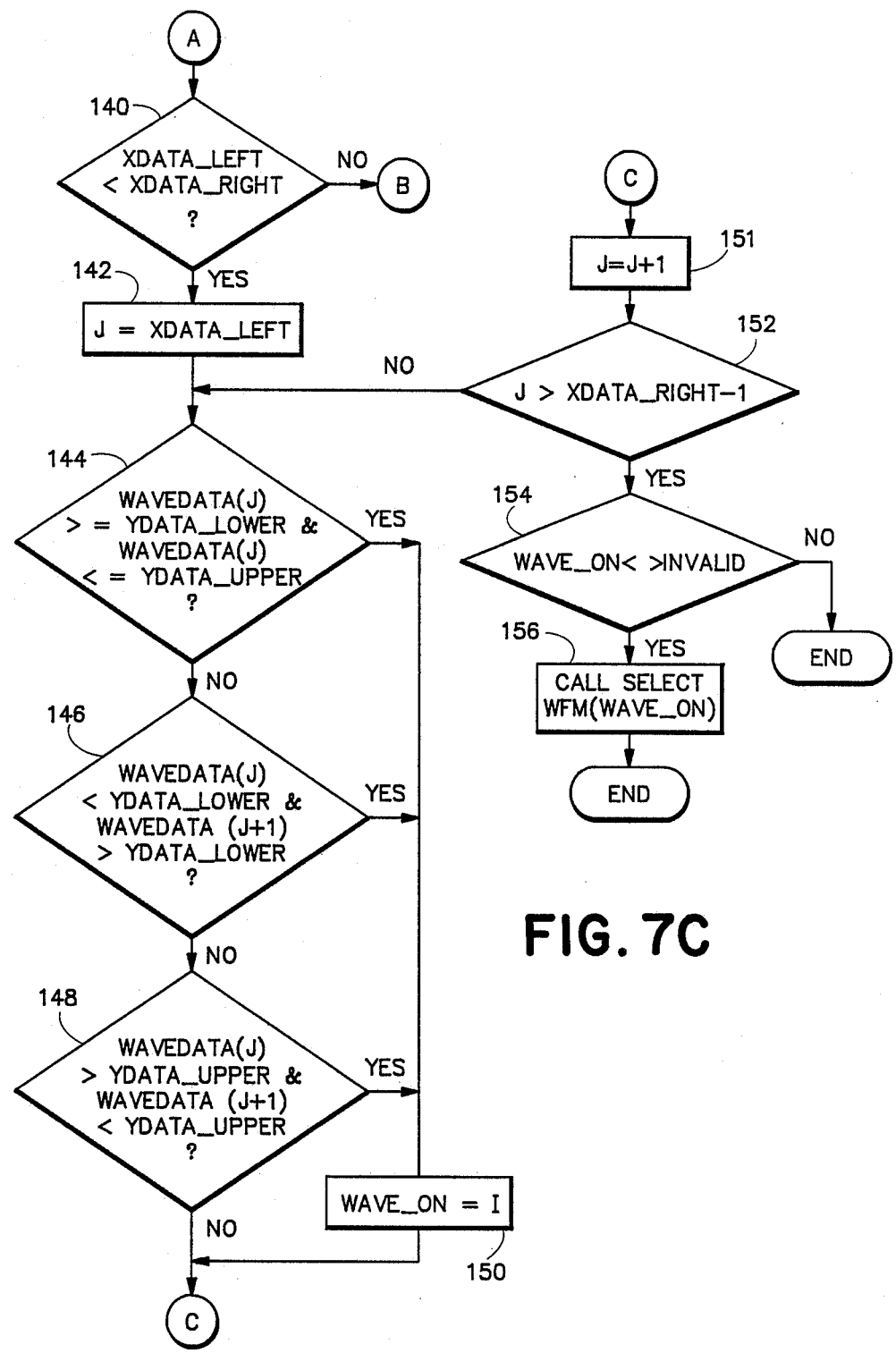

A subroutine enabling the microcomputer to carrying out the operation of block 119 of FIG. 6 is described in copending U.S. Pat. application Ser. No. 06/944,304, filed Dec. 19, 1986, entitled "Waveform Selection By Touch", and FIGS. 7A–7C show a flow chart for programming the computer to carry out this subroutine wherein the computer determines whether a waveform passes through the last touch zone touched by an operator. The subroutine is called after the microcomputer determines that the operator has stopped touching the screen and after determining that the last touch zone touched lies within the waveform display area and does not include a selectable menu item. The last selected touch zone is identified by two parameters xtouch and ytouch which indicate horizontal and vertical touch zone grid. The values of xtouch and ytouch are determined and stored in memory by the microcomputer after the operator touches the touch zone.

Starting in block 120, an "axis search" flag is set to an "invalid" state and then (block 122) the value of ytouch is checked to ensure that the touch zone is within the waveform display area of the screen and not too far to the right or the left. If the touch zone is in the waveform display area, then (block 124) the axis search flag is set to a valid state and the values of two parameters ydata_upper and ydata_lower are calculated. The ydata_upper and ydata_lower parameters indicate vertical positions on the screen of the upper and lower edges of the rectangular touch zone which positions may be computed from the value of ydata, which indicates where on the screen the center of the touch zone lies, and from the known vertical dimension of the touch zone.

After block 124, or after block 122 if the touch zone is not in the waveform display area, the microcomputer sets a wave_on flag to an "invalid" state (block 126) and then checks to see if the axis search flag is still invalid (block 128). If the axis search flag is invalid, indicating that the touch zone is outside the waveform display area, the subroutine ends. However, if the axis search flag is valid, a counter I is set to 0 (block 129). In the preferred embodiment of the invention, the oscilloscope is capable of simultaneously displaying up to 8 different waveforms numbered from 0 to 7 and the counter I is a reference to the waveform number. Information concerning various aspects of the display of each waveform is stored in RAM 48 of FIG. 2, and if I is not greater than 7 (block 130), the microcomputer checks the display information stored in RAM 48 to determine if waveform I is actively displayed (block 134). If not, the value of I is incremented (block 132), and if I is not yet greater than 7 (block 130), the microcomputer again checks display information in RAM 48 to see if the next waveform is displayed.

The subroutine continues to loop through blocks 130, 134 and 132 until in block 134 it is determined that a waveform is displayed, or until in block 130 I attains a value of 8. In the latter case, no waveform is displayed and therefore no waveform can pass through the touch zone. Thus, the subroutine ends after block 130. However, if the microcomputer finds in block 134 that a waveform is displayed, it finds from the value of xdata (block 136) the values of two parameters, xdata_left and xdata_right. The xdata_left and xdata_right parameters indicate a waveform data record in waveform memory 32 containing digitized waveform data corresponding to the first and last pixels of waveform I which are displayed at horizontal screen positions falling between the horizontal screen positions of the left and right edges of the the touch zone. The xdata_left parameter value is computed by dividing the number of waveform data values in the record utilized to represent the waveform by one less than the number of touch zones spanning the width of the screen and multiplying the result by xtouch−1. The xdata_right parameter value is computed by dividing the number of waveform data values utilized to represent the waveform by one less than the number of touch zones spanning the width of the screen and multiplying the result by xtouch.

In block 140 the computer checks to see that xdata-left is less than xdata right. This is always true unless the waveform record length is zero. If the record length is zero, no waveform data has been stored for waveform I and therefore no waveform is displayed. In such case, waveform I cannot pass through the touch zone, and the routine returns to block 132 to increment I and begin investigating the next waveform. When xdata_left is less than xdata_right, an integer variable J is set to xdata_left (block 142). J indicates the Jth data position in the waveform data record for waveform I. The microcomputer then performs a series of three tests to determine if waveform I passes through the selected touch zone.

In the first test (block 144) it checks to see if wavedata(J), the value of waveform data at the Jth position, is between ydata_lower and ydata_upper. If so, this indicates that the Jth pixel of waveform I is displayed between the upper and lower edges of the touch zone.

Since it has been established that the Jth pixel is horizontally situated between the left and right edges of the touch zone, then it is certain that the point falls within all boundaries of the touch zone and therefore, that the operator has selected the waveform. In such case, the microcomputer sets the value of a wave_on parameter to I (block 150) to indicate that waveform I has been selected.

When the Jth pixel of waveform I does not fall within the touch zone, the microcomputer checks (block 146) to see if wavedata(J) is less than ydata_lower and if wavedata(J+1), the magnitude of data at waveform record position J+1, is greater than ydata_lower. This second test is necessary, for example, when waveform I is an abruptly rising square wave and the touch zone is on the leading edge. In such case the Jth pixel may be just below the lower edge of the touch zone and pixel J+1 may be just above the upper edge of the touch zone. If the result of the test of block 146 is positive, then waveform I has been selected and wave_on is set to I in block 150. Otherwise, the microcomputer performs the third test (block 148) wherein it checks to see if wavedata(J) is greater than ydata_upper and wavedata(J+1) is less than ydata_upper. This situation can occur when the touch zone is situated over the falling edge of a squarewave and points J and J+1 are above and below the upper and lower edges of the touch zone, respectively. In such case, wave_on is set to I in block 150.

If the combination of wavedata(J) and wavedata(J+1) fails all three tests in blocks 144, 146 and 148, or after wave_on is set to I in block 150, then the value of J is incremented (block 151). If the value of J has not surpassed xdata_right−1, then the three tests of blocks 144, 146 and 148 are repeated for the new waveform data positions J and J+1 utilizing the incremented value of J. When the tests have been performed for all values of J between xdata_left and xdata_right−1, the value of wave_on is checked to see if it is still set to its "invalid" value which indicates that a waveform was not selected. If so, the subroutine ends without causing the oscilloscope to reconfigure to account for a change in selected waveform. However, if wave_on is set to a value from 0 to 7, indicating a waveform was selected, then in block 156, a "select_wfm(wave_on)" subroutine is called. This subroutine causes the display of the waveform indicated by wave_on to be highlighted and causes the display of any previously selected waveform to be dehighlighted in order to provide an indication to the operator as to which waveform was selected. The select waveform subroutine also reconfigures the oscilloscope operating state to ensure that oscilloscope operations carried out with respect to the "selected" waveform are subsequently carried out with respect to the waveform indicated by the wave_on parameter. Actions performed by the select waveform subroutine may include, for example, the setting of the values of one or more global variables accessible by other subroutines that perform operations with respect to the selected waveform, such as subroutines which respond to operation of front panel knobs 16 of FIG. 1.

Thus the present invention is utilized in a system wherein a computer controls display of operator selectable items on a screen and determines from data provided by a touchscreen device when the operator has touched or stopped touching a point on the screen within a particular touch zone of a grid of such touch zones superimposed on the screen. In accordance with the invention, when touchscreen input indicates that the operator is touching a touch zone containing a portion of a single selectable item displayed on the screen, the computer provides a display on the screen distinguishing the selectable item as being touched. When the computer determines that the operator is touching a touch zone which may contain portions of more than one selectable item displayed on the screen, the computer provides a display on the screen indicating the touch zone touched and indicating that if the touch zone does contain a portion of a selectable item, an item will be selected if the operator stops touching the touch zone. Finally, when the computer determines that the operator is touching a touch zone which cannot contain a portion of any selectable item, the computer provides a display on the screen indicating the touch zone touched and indicating that no item will be selected when the operator stops touching the touch zone.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

We claim:

1. For an instrument comprising a screen, means for generating output signals indicating when an object is proximate said screen and indicating a particular touch zone area of a plurality of touch zone areas of said screen to which said object is proximate, and control means responsive to said output siqnals for generating displays of images on said screen, a method for said control means for responding to said output signals, the method comprising the steps of:

monitoring said output signals to determine when an object is proximate said screen;

determining from said output signals the particular touch zone to which said object is proximate;

determining whether a portion of a particular image is displayed on said screen within boundaries of said particular touch zone;

generating a display of a first indicating image on said screen visually distinguishing said particular image displayed on said screen when any portion of said particular image is included within boundaries of said particular touch zone; and generating a display of a second indicating image on said screen visually identifying said particular touch zone when no portion of any image displayed on said screen is included within boundaries of said particular touch zone.

2. The method according to claim 1 further comprising the step of terminating display of said second indicating image on said screen when said output signals indicate said object is no longer proximate to said particular touch zone.

3. The method according to claim 1 wherein said second indicating image indicates boundaries of said particular touch zone.

4. For an instrument comprising a screen, means for generating output signals indicating when an object is proximate said screen and indicating a particular touch zone area of a plurality of touch zone areas of said screen to which said object is proximate, and control means responsive to said output signals for producing displays of waveforms in a waveform display area of said screen and for producing displays of images other than waveforms on said screen, a method for said control means for responding to said output signals, the method comprising the steps of:

monitoring said output signals to determine when an object is proximate said screen;

generating a display of a first indicating image on said screen visually distinguishing said particular touch zone from all others of said plurality of touch zones when said touch zone is included in said waveform area and no portion of any image other than a waveform is displayed on said screen within boundaries of said particular touch zone; and generating a display of a second indicating image on said screen visually identifying said particular touch zone when said touch zone is not included in said waveform area and no portion of any image other than a waveform is displayed on said screen within boundaries of said particular touch zone, said first and second images being recognizably distinct.

5. The method according to claim 4 wherein said first indicating image indicates boundaries of said particular touch zone.

6. The method according to claim 4 wherein said second indicating image indicates boundaries of said particular touch zone.

7. The method according to claim 4 wherein said first and second indicating images indicate boundaries of said particular touch zone.

8. An instrument comprising:

a screen for displaying waveforms in a waveform display area thereof and for displaying images other than waveforms;

means for generating output signals indicating when an object is proximate said screen and indicating a particular touch zone area of a plurality of touch zone areas of said screen to which said object is proximate; and means responsive to said output signals for generating a dlsplay of a first indicating image on said screen visually distinguishing said particular touch zone from all others of said plurality of touch zones when said output signals indicate said particular touch zone is included in said waveform area and no portion of any image other than a waveform is displayed on said screen within boundaries of said particular touch zone, and for generating a display of a second indicating image on said screen visually distinguishing said particular touch zone from all others of said plurality of touch zones when said output signals indicate said particular touch zone is not included in said waveform area and no portion of any image other than a waveform is displayed on said screen within boundaries of said particular touch zone, said first and second images being recognizably distinct one from another.

9. The instrument according to claim 8 where said images other than waveforms comprise selectable portions of menus.

* * * * *